United States Patent
Wang et al.

(10) Patent No.: US 11,563,044 B2
(45) Date of Patent: Jan. 24, 2023

(54) PIXEL-ARRAY SUBSTRATE AND DEFECT PREVENTION METHOD

(71) Applicant: OmniVision Technologies, Inc., Santa Clara, CA (US)

(72) Inventors: Qin Wang, San Jose, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 113 days.

(21) Appl. No.: 16/905,670

(22) Filed: Jun. 18, 2020

(65) Prior Publication Data

US 2021/0399028 A1 Dec. 23, 2021

(51) Int. Cl.
*H01L 27/146* (2006.01)

(52) U.S. Cl.
CPC ...... *H01L 27/1462* (2013.01); *H01L 27/1463* (2013.01); *H01L 27/14685* (2013.01); *H01L 27/14627* (2013.01)

(58) Field of Classification Search
None
See application file for complete search history.

(56) References Cited

U.S. PATENT DOCUMENTS

| 9,281,331 B2* | 3/2016 | Chen | H01L 29/4236 |
| 2016/0099278 A1* | 4/2016 | Guyader | H01L 27/1203 |
| | | | 257/432 |
| 2016/0225813 A1* | 8/2016 | Liao | H01L 27/1464 |
| 2017/0062496 A1* | 3/2017 | Lai | H01L 27/1464 |
| 2018/0061875 A1 | 3/2018 | Roy | |
| 2018/0174888 A1 | 6/2018 | Chou et al. | |
| 2019/0165009 A1* | 5/2019 | Wu | H01L 27/14685 |
| 2020/0135792 A1* | 4/2020 | Wu | H01L 27/1463 |

* cited by examiner

*Primary Examiner* — Ali Naraghi
(74) *Attorney, Agent, or Firm* — Lathrop GPM LLP

(57) ABSTRACT

A pixel-array substrate includes a semiconductor substrate and a passivation layer. The semiconductor substrate includes a pixel array surrounded by a periphery region. A back surface of the semiconductor substrate forms, in the periphery region, a plurality of first peripheral-trenches extending into the semiconductor substrate. The passivation layer is on the back surface and lines each of the plurality of first peripheral-trenches.

20 Claims, 3 Drawing Sheets

PIXEL-ARRAY SUBSTRATE AND DEFECT PREVENTION METHOD

BACKGROUND

Camera modules in commercial products such as stand-alone digital cameras, mobile devices, automotive components, and medical devices include an image sensor. The image sensor includes a pixel array and, in a periphery region surrounding the pixel array, analog devices. The image sensor includes a semiconductor substrate and a passivation layer on the substrate's back surface. The passivation layer is prone to developing bubble defects particularly around large surface area due to material-induced stress. The bubble defects often become cracked regions or peeling regions of the passivation layer, which increases noise in the periphery analog devices, and hence degrades the quality of images captured by the image sensor.

SUMMARY OF THE EMBODIMENTS

Embodiments disclosed here prevent bubble defects by including trenches in the periphery region. In a first aspect, a pixel-array substrate includes a semiconductor substrate and a passivation layer. The semiconductor substrate includes a pixel array surrounded by a periphery region. A back surface of the semiconductor substrate forms, in the periphery region, a plurality of first peripheral-trenches extending into the semiconductor substrate. The passivation layer is on the back surface and lines each of the plurality of first peripheral-trenches.

A second aspect is a method for preventing defects in a thin film deposited on a semiconductor substrate that includes a pixel array. The method includes forming a plurality of trenches on a periphery-region of the semiconductor substrate to yield a trenched surface. The periphery region surrounds the pixel array. The trenched surface includes (i) a plurality of trench regions each forming a respective one of the plurality of trenches and (ii) between each pair of adjacent trenches, a respective one of a plurality of inter-trench surfaces. The method also includes depositing the thin film on the surface such that the thin film covers each inter-trench surface and conformally covers each trench region.

DETAILED DESCRIPTION OF THE EMBODIMENTS

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The term semiconductor substrate may refer to substrates formed using semiconductors such as silicon, silicon-germanium, germanium, gallium arsenide, and combinations thereof. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meanings.

Figure 1:
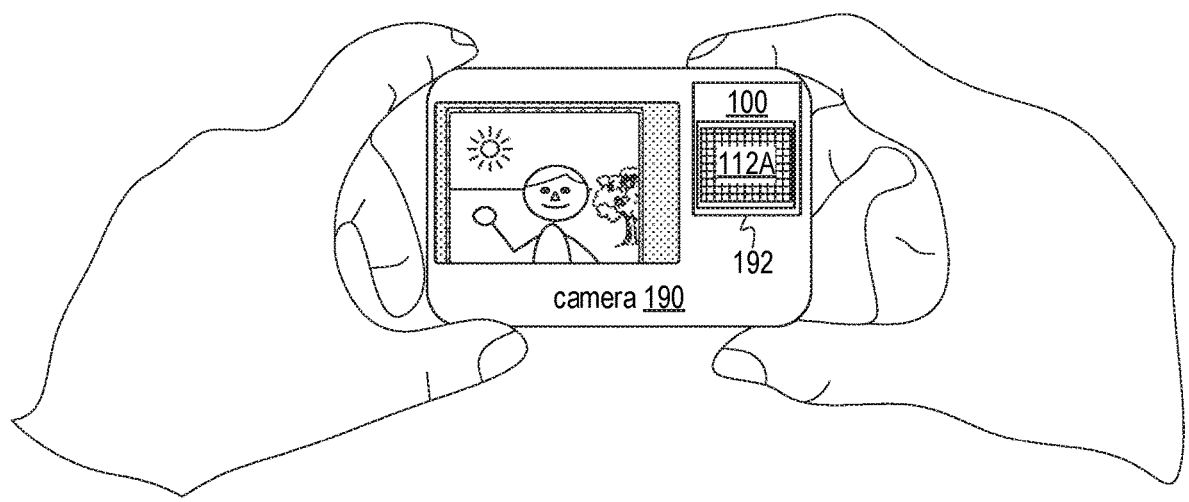
FIG. 1 depicts a camera imaging a scene.

FIG. 1 depicts a camera 190 imaging a scene. Camera 190 includes an image sensor 192, which includes a pixel-array substrate 100. Constituent elements of pixel-array substrate 100 may include at least one of silicon and germanium. Pixel-array substrate 100 includes a pixel array 112A. Image sensor 192 may part of a chip-scale package or a chip-on-board package.

Figure 2:
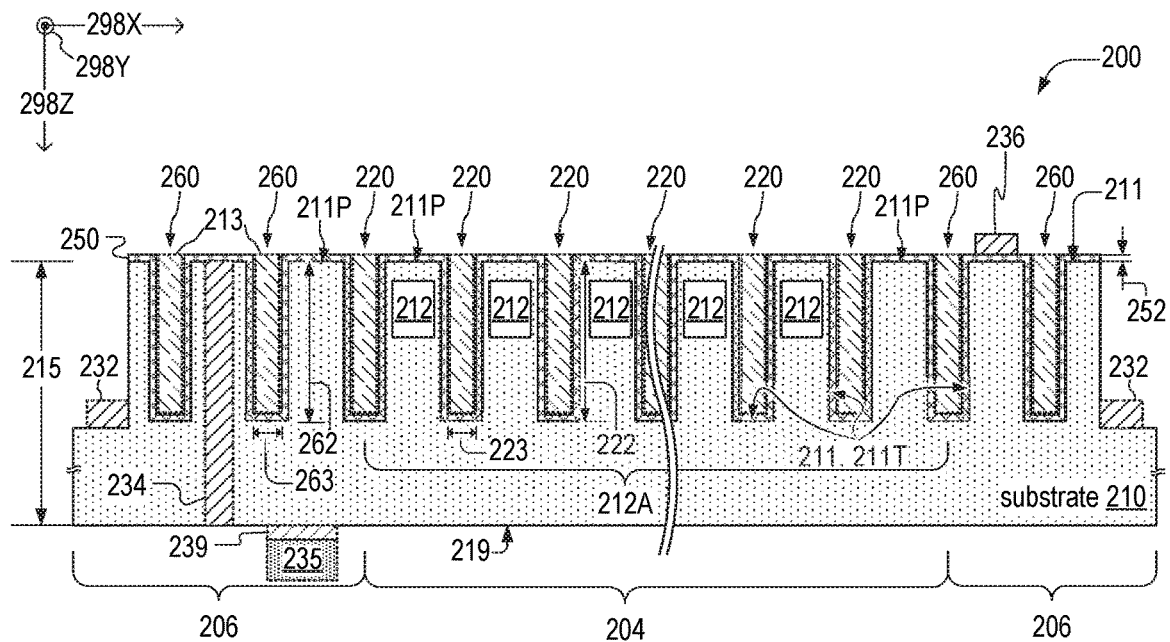
FIG. 2 is a cross-sectional schematic and FIG. 3 is a plan view of a pixel-array substrate, which is an example of a pixel-array substrate of the camera of FIG. 1, in an embodiment.
Figure 3:
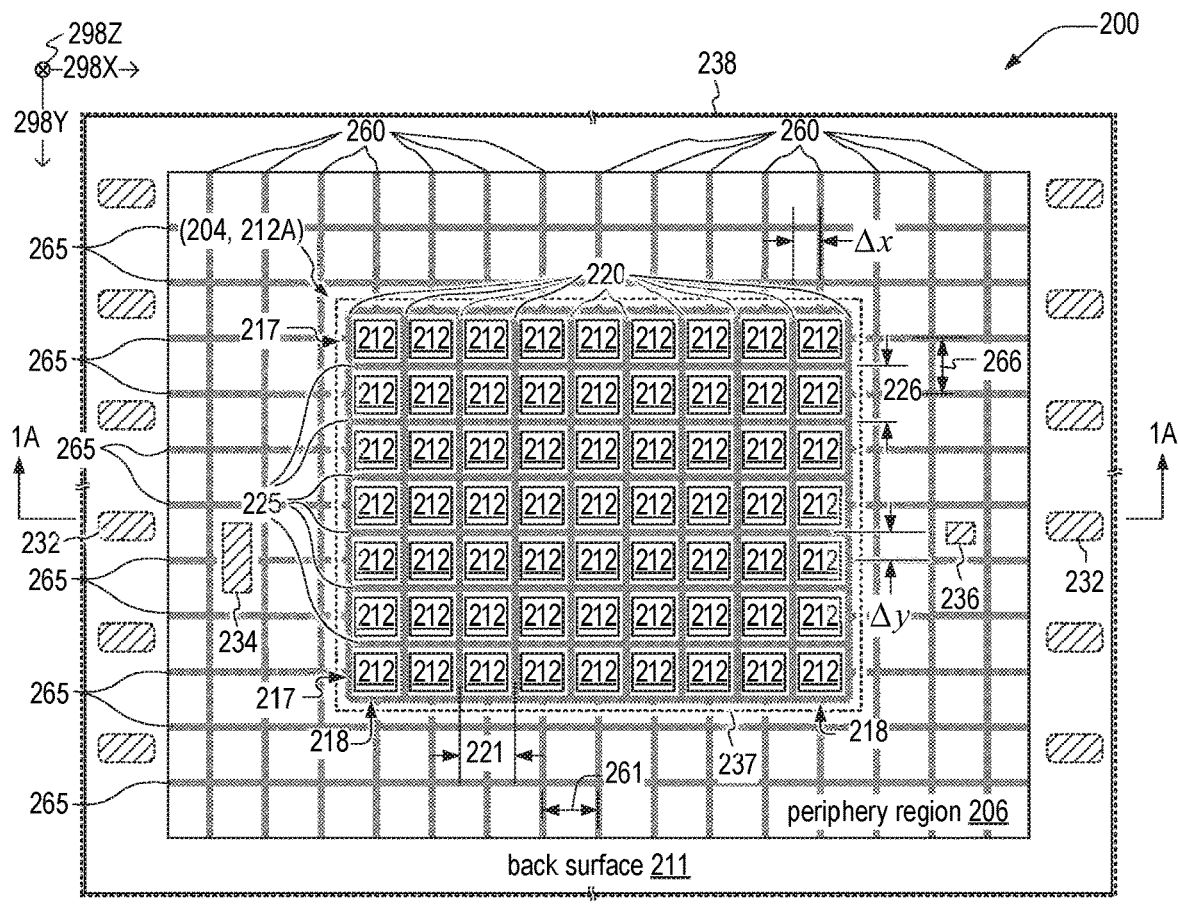

FIG. 2 cross-sectional schematic and FIG. 3 is a plan view of a pixel-array substrate 200, which is an example of pixel-array substrate 100. The cross-sectional view of FIG. 2 is in a plane 1A denoted in FIG. 3. The cross-section illustrated in FIG. 2 is parallel to a plane, hereinafter the x-z plane, formed by orthogonal axes 298X and 298Z, which are each orthogonal to an axis 298Y. Herein, the x-y plane is formed by orthogonal axes 298X and 298Y, and planes parallel to the x-y plane are referred to as transverse planes. Unless otherwise specified, heights of objects herein refer to the object's extent along axis 298Z. Herein, a reference to an axis x, y, or z refers to axes 298X, 298Y, and 298Z respectively. Also, herein, a horizontal plane is parallel to the x-y plane, a width refers to an object's extent along the y axis, and vertical refers to a direction along the z axis.

Pixel-array substrate 200 includes a semiconductor substrate 210 and a passivation layer 250. Passivation layer 250 may be formed of a high-κ material, e.g., a material having a dielectric constant κ greater than or equal that of silicon nitride (κ≥7). In embodiments, example materials for passivation layer 250 include aluminum oxide (Al$_2$O$_3$), hafnium oxide (HfO$_2$), tantalum pentoxide (Ta$_2$O$_5$), and combinations thereof. Passivation layer 250 has a thickness 252 which, in embodiments, is between a minimum thickness of forty angstroms and a maximum thickness of 500 angstroms. When thickness 252 is less than the minimum thickness, passivation layer 250 no longer functions as an effective passivation layer. When thickness 252 exceeds the maximum thickness, the excess thickness does not improve functioning of passivation layer 250, and hence needlessly increases the overall thickness of pixel-array substrate 200.

Semiconductor substrate 210 has a back surface 211, a front surface 219, and includes a central region 204 and a periphery region 206 that surrounds central region 204. Central region includes a pixel array 212A, which is an example of pixel array 112A, FIG. 1. Pixel array 212A includes a plurality of pixels, each of which includes a respective one of a plurality of photodiode regions 212. In embodiments, photodiode region 212 includes a pinned photodiode. Each pixel may also include one or more transistors for controlling imaging operation of the associated pixel. Each photodiode region 212 is configured to photogenerate and store charge in response to incident light pass through to back surface 211 of semiconductor substrate 210. In one embodiment, each photodiode region 212 is formed of doped implant having a second conductive type (e.g., n-type) opposite to a first conductive type (e.g., p type) of semiconductor substrate 210. In some embodiments, each photodiode region 212 is disposed closer to back surface 211 of semiconductor substrate 210, than it is to front surface 219. In embodiments, semiconductor substrate 210 includes a device gate 235 on or formed near surface 219. In embodiments, a gate oxide layer 239 is between device gate 235 and surface 219.

Pixel array 212A includes a plurality of pixel-rows 217 and a plurality of pixel-columns 218, which are parallel to the x and y axes, respectively. For clarity of illustration, not all pixel-rows 217 and pixel-columns 218 are denoted by a reference numeral in FIG. 3. Denoting $N_y$ and $N_x$ as the respective numbers of pixel-rows 217 and pixel-columns 218, each of $N_y$ and $N_x$ may exceed one-thousand. In embodiments, the ratio $N_x:N_y$ is equal to one of 1:1, 3:2, 4:3, 9:4, 16:9, and 17:6 such that an image sensor that includes pixel array 212A generates an image with a standard aspect ratio. In embodiments, the number of peripheral-trenches 260 exceeds $N_x$ and the number of peripheral-trenches 265 exceeds $N_y$.

Pixel-array substrate 200 includes a plurality of inter-column trenches 220 each located between a respective pair of adjacent pixel-columns 218. Pixel-array substrate 200 also includes a plurality of inter-row trenches 225 each located between a respective pair of adjacent pixel-rows 217. Each trench 220 and 225 is part of a deep-trench isolation (DTI) structure configured to electrically and/or optically isolate each photodiode region 212 from its neighboring photodiode regions 212. The plurality of inter-column trenches 220 and plurality of inter-row trenches 225 may be interconnected forming deep trench grid structure providing isolation between photodiode regions in pixel array 212A.

Each of the plurality of inter-column trenches 220 and the plurality of inter-row trenches 225 is formed on back surface 211 of semiconductor substrate 210 and extends a depth 222 into semiconductor substrate 210 toward front surface 219.

Each of the plurality of inter-column trenches 220 and the plurality of inter-row trenches 225 has passivation layer 252 lining the inner surface thereof for providing passivation to defects on trench sidewalls reduce dark current. In embodiments, each of the plurality of inter-column trenches 220 and the plurality of inter-row trenches 225 further has an insulating material 213, such as a low-κ dielectric, a metal-oxide or a semiconductor-oxide (e.g., silicon oxide), filling the trench. In embodiments, each of the plurality of inter-column trenches 220 and the plurality of inter-row trenches 225 has conductive material e.g., metal filling the trench for biasing.

In embodiments, semiconductor substrate 210 includes a plurality of bond pads 232 thereon. Each bond pad 232 is electrically connected to at least one pixel-row 217 or at least one pixel-column 218.

Adjacent inter-column trenches 220 are separated by a distance 221, which may equal a pixel pitch of pixel array 212A. Adjacent inter-row trenches 225 are separated by a distance 226, which may equal a pixel pitch of pixel array 212A. Herein and unless stated otherwise, statements made about inter-column trenches 220 apply equally to inter-row trenches 225.

In periphery region 206, back surface 211 forms a plurality of first peripheral-trenches, hereinafter peripheral-trenches 260, that extend a depth 262 into semiconductor substrate 210 toward front surface 219 and are either quasi-parallel to or parallel to pixel-columns 218. Depth 262 may be the same or different as depth 222. In embodiments, depth 262 is greater than or equal to depth 222. Herein, peripheral-trenches 260 being quasi-parallel to pixel-columns 218 means that peripheral-trenches 260 are oriented in a direction that is closer to being parallel to pixel-columns 218 than to pixel-rows 217. Passivation layer 250 is on back surface 211 and lines each of the plurality of peripheral-trenches 260.

In embodiments, back surface 211 also forms a plurality of second peripheral-trenches, hereinafter peripheral-trenches 265, which are similar to peripheral-trenches 260, except that they are either quasi-parallel to or parallel to pixel-rows 217. When peripheral-trenches 265 are quasi-parallel to pixel-rows 217, peripheral-trenches 265 are oriented in a direction that is closer to being parallel to pixel-rows 217 than to columns 218. In embodiments, each peripheral-trench 265 is perpendicular to each peripheral-trench 260. Herein and unless stated otherwise, statements made about peripheral-trenches 260 apply equally to peripheral-trenches 265. In embodiments, peripheral-trenches 260 and peripheral-trenches 265 are interconnected with each other.

In embodiments, semiconductor substrate 210 includes, between peripheral-trenches 260 and/or 265, one or more through-silicon vias 234 for chip stacking. In embodiments, semiconductor substrate 210 includes, between peripheral-trenches 260 and/or 265, one or more back-side ground contacts 236. In embodiments, semiconductor substrate 210 includes an implant guard ring structure 237 e.g., n-type doped guard ring and/or a seal ring 238 around a perimeter of semiconductor substrate 210. The implant guard ring 237 structure may surround the pixel array 212A. To maintain proper functioning of the above-mentioned components, a process margin (minimum distance) between any peripheral-trench 260 and/or 265 and at least one of the following elements may exceed a threshold value, such as one micrometer: through-silicon vias 234, back-side ground contacts 236, ring 237, and ring 238.

In the embodiments, there exist at least a semiconductor region allocated between adjacent peripheral-trenches 260 and/or 265 for forming chip packaging structures such as through-silicon vias 234, back-side ground contacts 236, bond pads, seal ring or guard ring structures, and implant guard ring. The size of the semiconductor region may be determined based on the required process margin for forming chip packaging structures.

In embodiments, peripheral-trenches 260 and/or 265 are absent in the regions of semiconductor substrate 210 where seal ring or guard ring structure for prevention moisture or pollutant from entering interior pixel circuitry and bond pads are formed.

Absent peripheral-trenches 260, passivation layer 250 endures stress in periphery region 206, which results in the aforementioned bubble defects and subsequent degradation in image quality. These defects have become more common as the size of periphery region 206 has increased in recent years as pixel counts of pixel array 212A have increased. Peripheral-trenches 260 prevent bubble defects near central region 204 by relieving this stress.

Adjacent peripheral-trenches 260 are separated by a distance 261. In embodiments, distance 261 equals distance 221. Adjacent peripheral-trenches 265 are separated by a distance 266. In embodiments, distance 261 equals distance 226.

Absent peripheral-trenches 260, 265, passivation layer 250 would have large surface area that allow stress to accumulate leasing to bubble defects. Hence, it is appreciated that peripheral-trenches 260, 265 form trench grid structure that divides the larger surface area of passivation layer 250 in peripheral region 206 into small regions releasing stress and preventing stress accumulation, thus eliminating bubble defects. In embodiments, formation of peripheral-trenches 260, 265 extended deep into semiconductor substrate 210 toward front surface 219 introduces fluorine atoms and hydrogen atoms that diffuse to front surface eliminating dangling bonds at oxide-silicon interface can further reduce dark current and/or noise, e.g., in device gate 235.

FIG. 3 illustrates peripheral-trenches 260 as laterally offset from inter-column trenches 220 along the x axis by a distance Δx. In embodiments, Δx equals zero such that when distance 261 equals distance 221, each peripheral-trench 260 is aligned to, and an extension of, a respective inter-column trench 220. In such embodiments, each inter-column trench 220 and peripheral-trench 260 aligned thereto to form a single trench.

FIG. 3 illustrates peripheral-trenches 265 as laterally offset from inter-row trenches 225 in the y direction by a distance Δy. In embodiments, Δy equals zero such that when distance 266 equals distance 226, each peripheral-trench 265 is aligned to, and an extension of, a respective inter-row trench 225. In such embodiments, each inter-row trench 225 and peripheral-trench 265 aligned and interconnect thereto to form a single trench. The single-trench may have a uniform depth, that is, its depth in pixel array 212A equals its depth in periphery region 206.

In embodiments, depth 262 of each peripheral trench 260 exceeds 0.2 micrometers to ensure adequate stress relief to prevent bubble defects. Depth 262 is relative to an inter-trench surface region 211P of back surface 211 adjacent to peripheral-trench 260 on one or both sides thereof. Inter-trench surface regions 211P may be coplanar. FIG. 2 denotes regions of back surface 211 within a trench 260 as a trench region 211T.

Semiconductor substrate 210 has a thickness 215. In embodiments, depth 222 of inter-column trenches 220 is less than a thickness 215 by between 0.5 micrometers and 2.0 micrometers to ensure sufficient electrical isolation. In embodiments, depth 262 equals depth 222 such that inter-column trench 220 and peripheral-trenches 260 aligned thereto can be fabricated simultaneously, via photolithography for example.

Each inter-column trench 220 has a width 223, which may be between 0.10 micrometers and 0.25 micrometers. Each peripheral-trench 260 has a width 263. In embodiments, width 263 equals width 223, which enables peripheral-trenches 260 and 220 to be formed simultaneously with a single lithographic mask having uniform-width features.

In embodiments, each inter-column trench 220 is filled with insulating material 213, which contributes to isolating each photodiode region 212 from its neighboring photodiode region 212. In embodiments, both inter-column trenches 220 and peripheral-trenches 260 are filled with insulating material 213. In embodiments, when depositing insulating material 213 in inter-column trenches 220 there is no technical benefit to masking off periphery region 206 to prevent insulating material 213 from filling peripheral-trenches 260. Such masking merely complicates the deposition process. For clarity of illustration, FIG. 3 does not denote insulating material 213.

Figure 4:
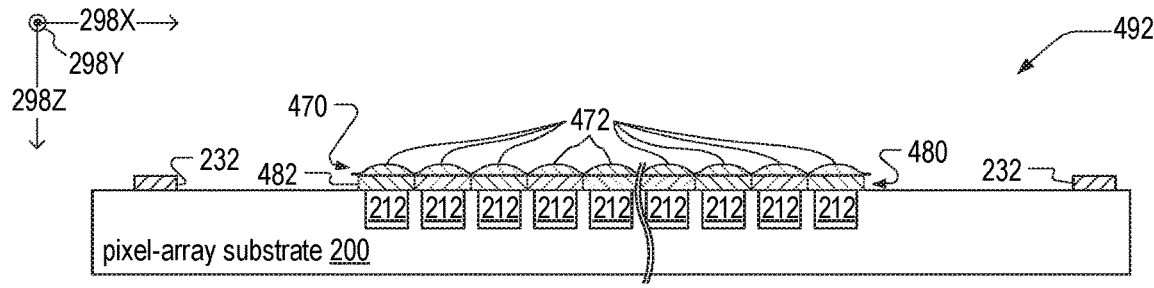
FIG. 4 is a cross-sectional schematic of an image sensor that includes the pixel-array substrate of FIGS. 2 and 3, in an embodiment.

FIG. 4 is a cross-sectional schematic of an image sensor 492, which is an example of image sensor 192, FIG. 1. Image sensor 492 includes pixel-array substrate 200 and a microlens array 470. Microlens array 470 is formed of a plurality of microlenses 472 each aligned to a respective photodiode region 212 of pixel array 212A for direct incident light onto respective photodiode region 212. In embodiments, image sensor 492 includes a color-filter array 480 between microlens array 470 and pixel array 212A. Color-filter array 480 includes a plurality of color filters 482, each of which is aligned to a respective microlens 472 and a respective pixel 212 for spectrally filtering light transmitted through the respective microlens 472.

Figure 5:
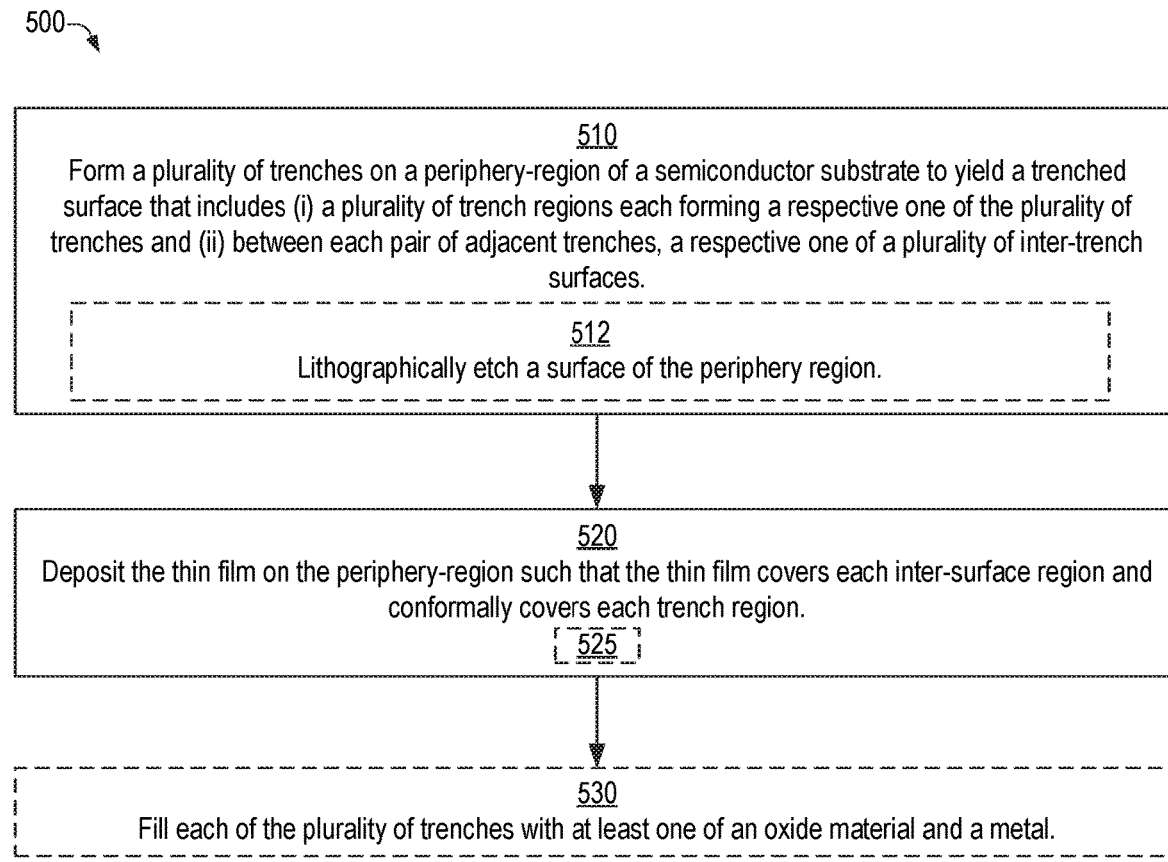
FIG. 5 is a flowchart illustrating a method for preventing defects in a thin film deposited on a substrate, in an embodiment.

FIG. 5 is a flowchart illustrating a method 500 for preventing defects in a thin film deposited on a semiconductor substrate that includes a pixel-array. Method 500 includes steps 510 and 520. In embodiments, method 500 also includes step 530. Method 500 may be performed after front-side processes including, but not limited to, formation of shallow trench isolation structures, implantation of photodiode regions, floating diffusions, source/drains of pixel transistors, formation of gates (e.g., polysilicon gate) and spacer of transistors, and formation of contacts and multi-layer metal interconnection structures.

Step 510 includes forming a plurality of trenches on a periphery-region of the semiconductor substrate to yield a trenched surface. The trenched surface includes (i) a plurality of trench regions each forming a respective one of the plurality of trenches and (ii) between each pair of adjacent trenches, a respective one of a plurality of inter-trench surfaces. The periphery region surrounds the pixel array. In an example of step 510 peripheral-trenches 260 are formed on a surface of semiconductor substrate 210, where back surface 211 is the trenched surface that includes trench regions 211T and inter-trench surface regions 211P.

In embodiments, each trench of the plurality of trenches is perpendicular to and intersecting at least one other trench of the plurality of trenches, the plurality of trenches forming a grid. For example, the plurality of trenches includes peripheral-trenches 260 and peripheral-trenches 265.

In embodiments, the semiconductor substrate includes a central region surrounded by the periphery region, and step 510 the plurality of trenches includes a plurality of central-region trenches. Each central-region trench traverses both the peripheral region and the central region and is located between either (i) a pair of adjacent pixel-rows of the pixel array and (ii) a pair of adjacent pixel-columns of the pixel array. Inter-column trenches 220 and inter-row trenches 225 are examples of the central-region trenches.

In embodiments, step 510 includes step 512. Step 512 includes lithographically etching a surface of the periphery region. In an example of step 512, back surface 211 is lithographically etched to yield at least one of peripheral-trenches 260 and peripheral-trenches 265. Step 512 may also yield at least one of inter-column trenches 220 and inter-row trenches 225. Step 512 may include etching (e.g., dry etching) the surface with a gas etchant containing fluorine. A benefit of using a fluorine etchant is that fluorine atoms that reach front surface 219 reduce dark current by eliminating dangling bonds beneath the oxide layer of pixel gates.

Step 520 includes depositing the thin film on the periphery-region such that the thin film covers each inter-trench surface, and conformally covers each trench region. In an example of step 520, passivation layer 250 is deposited on back surface 211, for example by atomic layer deposition (ALD) process, such that passivation layer 250 covers each inter-trench surface region 211P and conformally covers each trench region 211T.

In embodiments, step 520 includes step 525. Step 525 includes annealing the thin film using a hydrogen annealing process to densify the thin film and build negative charges on or surrounding sidewalls of each of inter-column trenches 220, inter-row trenches 225 and peripheral-trenches 260, 265. The annealing process may be performed at a temperature between 300° C. and 400° C. A benefit of said hydrogen annealing is that, like the aforementioned fluorine atoms, hydrogen atoms that reach front surface 219 reduce dark current by further eliminating dangling bonds at oxide-silicon interfaces e.g., at the interface between the oxide layer of pixel gates and logic gates and pixel-array substrate 100.

Step 530 includes filling each of the plurality of trenches with at least one of an oxide material and a metal e.g., tungsten, aluminum, titanium. Examples of oxide materials include oxides of semiconductors, such as silicon dioxide. In an example of step 530, each peripheral-trench 260 is filled with insulating material 213. When semiconductor substrate 210 includes peripheral-trenches 265, step 530 may also include filling each peripheral-trench 265 with insulating material 213. In an example of step 530, each of trenches 220, trenches 225, and trenches 260 (and 265 when applicable) are filled with insulating material in a single step, such as a single deposition step (e.g. a chemical vapor deposition process). A chemical mechanical polishing process may be applied thereafter.

Combinations of Features

Features described above, as well as those claimed below, may be combined in various ways without departing from the scope hereof. The following enumerated examples illustrate some possible, non-limiting combinations:

(A1) A pixel-array substrate includes a semiconductor substrate and a passivation layer. The semiconductor substrate includes a pixel array surrounded by a periphery region. A back surface of the semiconductor substrate forms, in the periphery region, a plurality of first peripheral-trenches extending into the semiconductor substrate. The passivation layer is on the back surface and lines each of the plurality of first peripheral-trenches. The pixel array includes a plurality of pixels. Each pixel of the plurality of pixels includes a respective photodiode region.

(A2) Pixel-array substrate (A1) may further include a plurality of inter-column trenches each located between a respective pair of adjacent pixel-columns of the pixel array, a first distance between adjacent inter-column trenches being equal to a distance between adjacent first peripheral-trenches.

(A3) In pixel-array substrate (A2), each of the plurality of first peripheral-trenches may be an extension of a respective one of the plurality of inter-column trenches.

(A4) In any of pixel-array substrates (A1)-(A3), each trench of the plurality of first peripheral-trenches may have a depth exceeding 0.2 micrometers relative to a planar region of the back surface surrounding the trench.

(A5) In any of pixel-array substrates (A1)-(A4), each trench of the plurality of first peripheral-trenches has a depth, relative to a planar region of the back surface surrounding the trench, that may be less than a thickness of the semiconductor substrate by between 0.5 micrometers and 2.0 micrometers.

(A6) In any of pixel-array substrates (A1)-(A5), a thickness of the passivation layer may be between 40 angstroms and 500 angstroms.

(A7) In any of pixel-array substrates (A1)-(A6), the passivation layer may be formed of a high-κ material.

(A8) In any of pixel-array substrates (A1)-(A7), each of the plurality of first peripheral-trenches may have a width between 0.15 micrometers and 0.25 micrometers.

(A9) In any of pixel-array substrates (A1)-(A8), each of the plurality of first peripheral-trenches may be filled with an insulating material.

(A10) In any of pixel-array substrates (A1)-(A9), the back surface may also form, in the periphery region, a plurality of second peripheral-trenches extending into the semiconductor substrate, each of the plurality of second peripheral-trenches being perpendicular to each of the plurality of first peripheral-trenches. The passivation layer lines each of the plurality of second peripheral-trenches.

(A11) Pixel-array substrate (A10) may further include a plurality of inter-row trenches each located between a respective pair of adjacent pixel-rows of the pixel array, a second distance between adjacent inter-row trenches being equal to a distance between adjacent second peripheral-trenches.

(A12) In pixel-array substrate (A11), each of the plurality of second peripheral-trenches may be an extension of a respective one of the plurality of inter-row trenches.

(A13) In any of pixel-array substrates (A11)-(A12), each trench of the plurality of second peripheral-trenches having a depth, relative to a planar region of the back surface surrounding the trench, that may be less than a thickness of the semiconductor substrate by between 0.5 micrometers and 2.0 micrometers.

(B1) An image sensor includes any of pixel-array substrates (A1)-(A13), and a microlens array formed of a plurality of microlenses each aligned to a respective photodiode region of the pixel array.

A method (C1) for prevents defects in a thin film deposited on a semiconductor substrate that includes a pixel array. Method (C1) includes forming a plurality of trenches on a periphery-region of the semiconductor substrate to yield a trenched surface. The periphery region surrounds the pixel array. The trenched surface includes (i) a plurality of trench regions each forming a respective one of the plurality of trenches and (ii) between each pair of adjacent trenches, a respective one of a plurality of inter-trench surfaces. The method also includes depositing the thin film on the surface such that the thin film covers each inter-trench surface and conformally covers each trench region. The pixel array includes a plurality of pixels. Each pixel of the plurality of pixels includes a respective photodiode region.

(C2) In method (C1), forming the plurality of trenches may include lithographically etching a surface of the periphery region, the surface being part of a back surface of the semiconductor substrate.

(C3) Either of methods (C1) and (C2) may further include annealing the thin film and filling each of the plurality of trenches with at least one of an oxide material and a metal.

(C4) In any of methods (C1)-(C3), in the step of forming the plurality of trenches, each trench of the plurality of trenches may be perpendicular to and intersecting at least one other trench of the plurality of trenches. The plurality of trenches may form a grid.

(C5) In any of methods (C1)-(C4), the semiconductor substrate including a central region surrounded by the periphery region and, in the step of forming, the plurality of trenches including a plurality of central-region trenches each traversing both the peripheral region and the central region and being located between either (i) a pair of adjacent pixel-rows of the pixel array and (ii) a pair of adjacent pixel-columns of the pixel array.

(C6) In any of methods (C1)-(C5), each inter-trench surface may be a respective planar region of a back surface of the semiconductor substrate between two adjacent trenches of the plurality of trenches Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A pixel-array substrate comprising:
   a semiconductor substrate including a pixel array surrounded by a periphery region;
   a back surface of the semiconductor substrate forming, in the periphery region, a plurality of first peripheral-trenches extending into the semiconductor substrate;
   a passivation layer on the back surface and lining each of the plurality of first peripheral-trenches; and
   a plurality of inter-column trenches each located between a respective pair of adjacent pixel-columns of the pixel array, each of the plurality of first peripheral-trenches being an extension of a respective one of the plurality of inter-column trenches.

2. The pixel-array substrate of claim 1,
   a first distance between adjacent inter-column trenches being equal to a distance between adjacent first peripheral-trenches.

3. The pixel-array substrate of claim 1, each trench of the plurality of first peripheral-trenches having a depth exceeding 0.2 micrometers relative to a planar region of the back surface surrounding the trench.

4. The pixel-array substrate of claim 1, each trench of the plurality of first peripheral-trenches having a depth, relative to a planar region of the back surface surrounding the trench, that is less than a thickness of the semiconductor substrate by between 0.5 micrometers and 2.0 micrometers.

5. The pixel-array substrate of claim 1, a thickness of the passivation layer being between 40 angstroms and 500 angstroms.

6. The pixel-array substrate of claim 1, the passivation layer being formed of a high-κ material.

7. The pixel-array substrate of claim 1, each of the plurality of first peripheral-trenches having a width between 0.15 micrometers and 0.25 micrometers.

8. The pixel-array substrate of claim 1, each of the plurality of first peripheral-trenches being filled with an insulating material.

9. The pixel-array substrate of claim 1,
   the back surface also forming, in the periphery region, a plurality of second peripheral-trenches extending into the semiconductor substrate, each of the plurality of second peripheral-trenches being perpendicular to each of the plurality of first peripheral-trenches,
   the passivation layer lining each of the plurality of second peripheral-trenches.

10. The pixel-array substrate of claim 9, further comprising:
    a plurality of inter-row trenches each located between a respective pair of adjacent pixel-rows of the pixel array, a second distance between adjacent inter-row trenches being equal to a distance between adjacent second peripheral-trenches.

11. The pixel-array substrate of claim 10, each of the plurality of second peripheral-trenches being an extension of a respective one of the plurality of inter-row trenches.

12. The pixel-array substrate of claim 10, each trench of the plurality of second peripheral-trenches having a depth, relative to a planar region of the back surface surrounding the trench, that is less than a thickness of the semiconductor substrate by between 0.5 micrometers and 2.0 micrometers.

13. The pixel-array substrate of claim 9, the plurality of a plurality of first peripheral-trenches and the plurality of second peripheral-trenches forming a trench grid structure.

14. An image sensor comprising:
    the pixel-array substrate of claim 1; and
    a microlens array formed of a plurality of microlenses each aligned to a respective photodiode region of the pixel array.

15. The pixel-array substrate of claim 1, the passivation layer also lining each of the plurality of inter-column trenches.

16. A pixel-array substrate comprising:
    a semiconductor substrate including a pixel array surrounded by a periphery region;
    a back surface of the semiconductor substrate forming, in the periphery region, a plurality of first peripheral-trenches extending into the semiconductor substrate and being filled with an insulating material; and
    a passivation layer on the back surface and lining each of the plurality of first peripheral-trenches.

17. A pixel-array substrate comprising:
    a semiconductor substrate having a substrate thickness and including a pixel array surrounded by a periphery region;
    a back surface of the semiconductor substrate forming, in the periphery region, a plurality of first peripheral-trenches each extending into the semiconductor substrate, and having a depth, relative to a planar region of the back surface surrounding the trench, that is less than the substrate thickness; and a passivation layer on the back surface and lining of each of the plurality of first peripheral-trenches.

18. The pixel-array substrate of claim 17, the depth being less than the substrate thickness between 0.5 micrometers and 2.0 micrometers.

19. The pixel-array substrate of claim 17, further comprising:

a plurality of second peripheral-trenches each (i) located in the periphery region, (ii) extending into the semiconductor substrate, (iii) being perpendicular to each of the plurality of first peripheral-trenches and (iv) having a depth, relative to a planar region of the back surface surrounding the trench, that is less than the substrate thickness; and the passivation layer further lining each of the plurality of second peripheral-trenches.

20. The pixel-array substrate of claim 19, the plurality of first peripheral-trenches and the plurality of second peripheral-trenches forming a trench grid structure;

each of the plurality of first peripheral-trenches and the plurality of second peripheral-trenches being filled with an insulating material.

\* \* \* \* \*